US006573181B1

(12) United States Patent
Srinivas et al.

(10) Patent No.: US 6,573,181 B1
(45) Date of Patent: Jun. 3, 2003

(54) METHOD OF FORMING CONTACT STRUCTURES USING NITROGEN TRIFLUORIDE PRECLEAN ETCH PROCESS AND A TITANIUM CHEMICAL VAPOR DEPOSITION STEP

(75) Inventors: Ramanujapuram A. Srinivas, San Jose, CA (US); Mohan K. Bhan, Cupertino, CA (US); Jennifer Kopp, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/698,820

(22) Filed: Oct. 26, 2000

(51) Int. Cl.[7] .............................................. H01L 21/44
(52) U.S. Cl. ........................ 438/656; 438/680; 438/963; 438/714
(58) Field of Search .................... 438/391, 700, 438/963, 906, 694, 723, 685, 656, 677, 710, 714, 734, 653, 654, 680

(56) References Cited

U.S. PATENT DOCUMENTS

| | | | | | |
|---|---|---|---|---|---|
| 4,585,517 A | * | 4/1986 | Stemple | ...................... | 156/643 |
| 5,015,330 A | | 5/1991 | Okumura et al. | ............ | 156/643 |
| 5,043,299 A | | 8/1991 | Chang et al. | ................ | 437/192 |
| 5,508,066 A | * | 4/1996 | Akahori | ....................... | 427/571 |
| 5,567,243 A | * | 10/1996 | Foster et al. | ................ | 118/730 |
| 5,747,384 A | | 5/1998 | Miyamoto | ................... | 438/685 |
| 5,834,371 A | | 11/1998 | Ameen et al. | ............... | 438/656 |
| 5,975,912 A | * | 11/1999 | Hillman et al. | .............. | 438/683 |
| 6,093,645 A | * | 7/2000 | Ameen et al. | ............... | 438/683 |
| 6,107,192 A | * | 8/2000 | Subrahmanyan et al. | ... | 438/637 |
| 6,110,836 A | | 8/2000 | Cohen et al. | ................ | 438/710 |
| 6,313,042 B1 | | 11/2001 | Cohen et al. | | |
| 6,346,489 B1 | | 2/2002 | Cohen et al. | | |

FOREIGN PATENT DOCUMENTS

| | | | | |
|---|---|---|---|---|
| EP | 0 536 664 B1 | 1/1997 | ............ | C23C/16/50 |
| EP | 0 798 777 A2 | 10/1997 | ......... | H01L/21/768 |
| EP | 1 047 123 A2 | 10/2000 | | |
| EP | 1 081 750 A2 | 3/2001 | | |
| EP | 1 081 751 A2 | 3/2001 | | |
| JP | 05021608 | * 1/1993 | | |
| JP | 8-176823 | 7/1996 | ............ | C23C/16/02 |
| JP | 9-205070 | 8/1997 | ......... | H01L/21/285 |
| JP | 11-67692 | * 3/1999 | | |
| JP | 11-067692 | 3/1999 | | |
| WO | WO 98/34445 | 8/1998 | ............ | H05K/3/26 |
| WO | WO 99/60601 A1 | 11/1999 | | |
| WO | WO 00/34997 A1 | 6/2000 | | |

OTHER PUBLICATIONS

Anonymous, RD314031, May 20, 1990, "Avoidance or sputtering redeposition". (Abstract only).*
IBM Tech. Discl. Bull. vol. 27, No. 5, p. 3175. (Oct. 1984). "Reactive gas mixtures for plasma hole cleaning".*
A. Bouteville et al., "LPCVD of Titanium Disilicide–Selectivity of Growth," J. Electrochem. Soc., vol. 134, No. 8, pp. 2080–2083 (Aug. 1987).
J. Lee et al., "Plasma Enhanced Chemical Vapor Deposition of Blanket $TiSi_2$ on Oxide Patterned Wafers–I. Growth of Silicide," J. Electrochem. Soc., vol. 139, No. 4, pp. 1159–1165 (Apr. 1992).
T. Taguwa, et al., "Low Contact Resistance Metallization for Gigabit Scale DRAMs Using Fully–Dry Cleaning by $Ar/H_2$ ECR Plasma," IEEE, pp. 695–698 (Oct. 1995).

* cited by examiner

*Primary Examiner*—Caridad Everhart
(74) *Attorney, Agent, or Firm*—Townsend & Townsend & Crew (57) ABSTRACT

A method of forming a contact in an integrated circuit including forming a dielectric layer over a silicon substrate, etching a contact hole through the dielectric layer, exposing the etched contact hole to a plasma formed from a preclean gas comprising nitrogen trifluoride and helium and, thereafter, depositing a titanium layer within the contact hole by a plasma CVD process, where the plasma CVD process heats the substrate to a temperature less than or equal to 650° C.

19 Claims, 4 Drawing Sheets

METHOD OF FORMING CONTACT STRUCTURES USING NITROGEN TRIFLUORIDE PRECLEAN ETCH PROCESS AND A TITANIUM CHEMICAL VAPOR DEPOSITION STEP

BACKGROUND OF THE INVENTION

The present invention relates to the manufacture of integrated circuits. More specifically, embodiments of the present invention relate to a method of forming contact structures in such integrated circuits by precleaning the contact area with a nitrogen trifluoride dry cleaning process and subsequently depositing a titanium layer over the contact area using a chemical vapor deposition process. The present invention is applicable to a variety of titanium deposition processes and is particularly applicable to processes that include titanium tetrachloride ($TiCl_4$) as a source of titanium.

One of the primary steps in fabricating modern semiconductor devices is forming various layers, including dielectric layers and metal layers, on a semiconductor substrate. As is well known, these layers can be deposited by chemical vapor deposition (CVD) or physical vapor deposition (PVD) among other methods. In a conventional thermal CVD process, reactive gases are supplied to the substrate surface where heat-induced chemical reactions take place to produce a desired film. In a conventional plasma CVD process, a controlled plasma is formed to decompose and/or energize reactive species to produce the desired film. In general, reaction rates in thermal and plasma processes may be controlled by controlling one or more of the following: temperature, pressure, plasma density, reactant gas flow rate, power frequency, power levels, chamber physical geometry, and others.

In an exemplary PVD system, a target (a plate of the material that is to be deposited) is connected to a negative voltage supply (direct current (DC) or radio frequency (RF) while a substrate holder facing the target is either grounded, floating, biased, heated, cooled, or some combination thereof. A gas, such as argon, is introduced into the PVD system, typically maintained at a pressure between a few millitorr (mTorr) and about 100 mTorr, to provide a medium in which a glow discharge can be initiated and maintained. When the glow discharge is started, positive ions strike the target, and target atoms are removed by momentum transfer. These target atoms subsequently condense into a thin film on the substrate, which is positioned on a substrate holder.

Semiconductor device geometries have dramatically decreased in size since such devices were first introduced several decades ago. Today's wafer fabrication plants are routinely producing 0.35 $\mu$m and even 0.18 $\mu$m feature size devices, and tomorrow's plants soon will be producing devices having even smaller feature sizes. As device feature sizes become smaller and integration density increases, increasingly stringent requirements for fabricating such semiconductor devices often need to be met and conventional substrate processing systems and/or technique may be inadequate to meet these requirements.

Figure 1A:
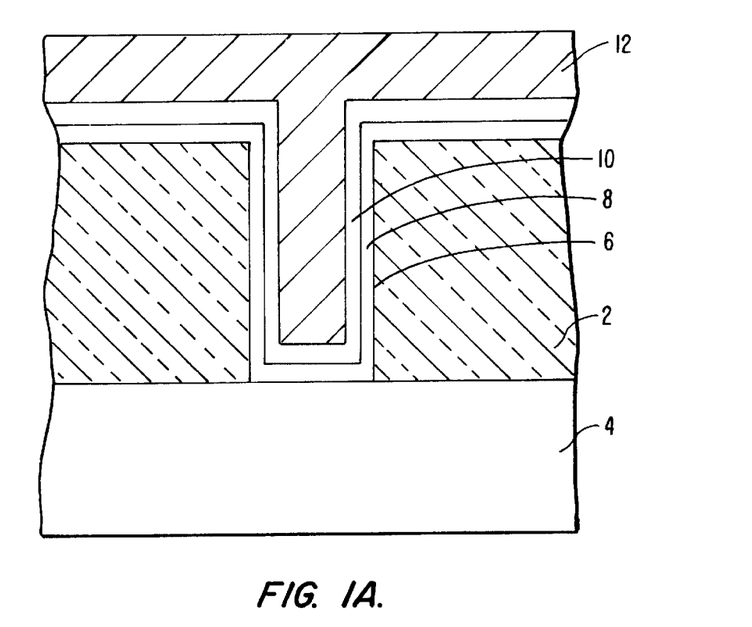
FIG. 1A shows a simplified cross-sectional view of an exemplary contact structure in which a titanium layer deposited according to the present invention may be employed.

The use of titanium is increasingly being incorporated into integrated circuit fabrication processes. One of the primary uses for titanium films in the manufacture of integrated circuits is as an initial adhesion layer in a titanium/titanium nitride stack that is part of a contact structure. Such a contact structure is shown in FIG. 1A, which is a cross-sectional view of an exemplary contact structure in which embodiments of the present invention may be employed. As seen in FIG. 1A, an oxide layer 2 (e.g., a BPSG film) is deposited over a substrate 4 having a surface of crystalline silicon. In order to provide electrical contact between a metal layer that will be subsequently formed above oxide layer 2 and the silicon substrate, a contact hole 6 is etched through oxide layer 2 and filled with a metal such as aluminum.

In many advanced integrated circuits, contact hole 6 is narrow, e.g., approximately 0.2 $\mu$m wide at the top, and has an aspect ratio of about 6:1 or greater. Filling such a hole is difficult, but a somewhat standard process has been developed in which hole 6 is first coated with a titanium layer 8. Titanium (Ti) layer 8 is then conformally coated with a titanium nitride (TiN) layer 10. Thereafter, an aluminum layer 12 is deposited, often by physical vapor deposition, to fill the contact hole 12 and to provide electrical interconnection lines on the upper level. Titanium layer 8 provides a glue layer to both the underlying silicon and the oxide on the sidewalls. Also, it can be silicided with the underlying silicon to form an ohmic contact. The TiN layer 10 bonds well to the Ti layer 8, and the aluminum layer 12 wets well to the TiN so that the aluminum can better fill contact hole 6 without forming an included void. Also, TiN layer 10 acts as a diffusion barrier that prevents aluminum 12 from migrating into silicon 4 and affecting its conductivity.

To properly fulfill its purpose, titanium layer 8 must have excellent bottom coverage, low resistivity, uniform resistivity and uniform deposition thickness both across the entire bottom of the contact and across the entire wafer (center to edge) among other characteristics. Also, it is preferred that titanium layer 8 deposit uniformly along the bottom of contact 6, but not deposit at all along the sidewalls. Preventing titanium deposition on the sidewalls prevents the phenomenon known as "silicon creep" where silicon from the contact area reacts with titanium in the sidewall and is transported from the contact bottom up into the sidewall.

In order to meet these requirements, many semiconductor manufacturers have turned to CVD titanium deposition techniques as opposed to titanium sputter deposition (PVD) techniques. Sputtering may damage previously deposited layers and structures in such devices creating performance and/or yield problems. Also, titanium sputtering systems may be unable to deposit uniform conformal layers in high aspect ratio gaps because of shadowing effects that occur with sputtering.

In contrast to sputtering systems, a plasma chemical vapor deposition system may be more suitable for forming a titanium film on substrates with high aspect ratio gaps. As is well known, a plasma, which is a mixture of ions and gas molecules, may be formed by applying energy, such as radio frequency (RF) energy, to a process gas in the deposition chamber under the appropriate conditions, for example, chamber pressure, temperature, RF power, and others. The plasma reaches a threshold density to form a self-sustaining condition, known as forming a glow discharge (often referred to as "striking" or "igniting" the plasma). This RF energy raises the energy state of molecules in the process gas and forms ionic species from the molecules. Both the energized molecules and ionic species are typically more reactive than the process gas, and hence more likely to form the desired film. Advantageously, the plasma also enhances the mobility of reactive species across the surface of the substrate as the titanium film forms, and results in films exhibiting good gap filling capability.

One known plasma CVD method of depositing titanium films includes forming a plasma from a process gas that includes a TiCl$_4$ source gas and a hydrogen (H$_2$) reactant gas. Such a plasma CVD TiCl$_4$/H$_2$ process may result in the deposition of a titanium film that has good via-fill, uniformity and contact resistance properties making the film appropriate for use in the fabrication of many different commercially available integrated circuits.

In order to achieve a contact resistance sufficiently low to meet some semiconductor manufacturers requirements for some small-width contact processes (e.g., contact holes having a diameter of less than or equal to 0.25 μm at bottom of the hole), however, deposition of the CVD titanium layer using a TiCl$_4$ source gas has been performed at a relatively high deposition temperature of about 680° C. As device sizes have continued to decrease, it has become important for semiconductor manufacturers to limit the overall thermal budget of the integrated circuit formation process. Thus, it is desirable to develop techniques that enable the deposition of a CVD titanium layer at temperatures lower than 680° C. while maintaining sufficient electrical and physical properties of the layer for use with high aspect ratio contact structures.

Figure 1B:
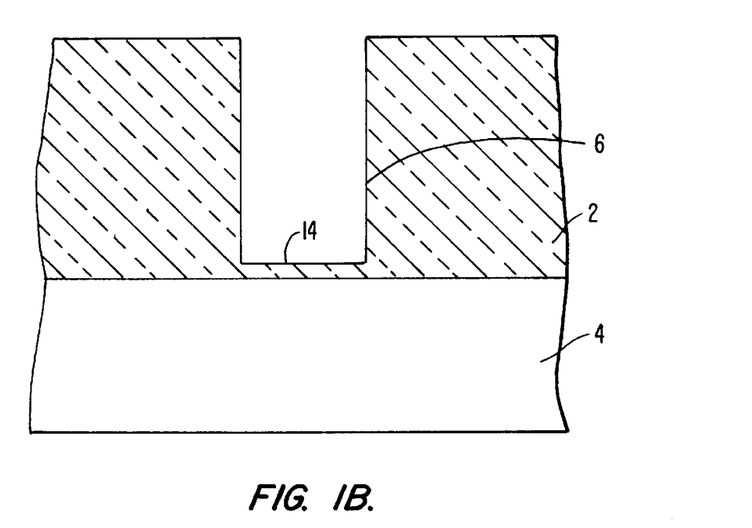
FIG. 1B is a simplified cross-sectional view illustrating the formation of a defect in the contact structure of FIG. 1A.

Prior to performing a titanium deposition step in the formation of a contact structure such as the structure of FIG. 1A, it is common to perform what is sometimes referred to in the industry as a preclean step. Such a preclean step is particularly beneficial in (1) removing any oxidation (SiO$_x$) that has grown in the contact area of the wafer after the formation of contact hole 6 and (2) further etching any silicon oxide from layer 2 that was unintentionally left in contact hole 6 after the hole formation (etching) step. The formation of oxidation between 10–50 Å thick is common if the wafer is exposed to the ambient for any appreciable length of time prior to contact formation. Also, some commercial fabrication processes do not completely etch away layer 2 and instead leave a thin unetched silicon oxide layer over the contact area. Such a layer is shown in FIG. 1B as layer 14 and may be between 100–250 Å thick or more depending on the process.

Depending on the thickness of this unetched layer 14 or any oxidation build-up on the wafer, the layer may prevent electrical contact from being made to the underlying substrate surface when titanium layer 8 is deposited without the benefit of a preclean step thereby resulting in a part failure that reduces the overall yield of the fabrication process. In other instances, layer 14 or the oxidation build-up is of a thickness that allows electrical contact to be made to the underlying silicon at an increased resistance level. Because of such, the manufactured device may not meet the manufacturer's performance requirements. In either of these cases, preclean steps can be used to etch away all or a portion of the remaining layer 14 or the oxidation build-up thus enabling improved electrical contact to substrate 2.

Several different preclean steps have been developed for this purpose. One commonly used preclean step includes dipping substrate 4 into a liquid hydrofluoric acid (HF) bath as a wet etch step prior to deposition of the titanium layer. Another preclean step includes exposing substrate 4 to a plasma of argon (Ar) that sputters away layer 14. In still other examples of previously known preclean step, substrate 4 is exposed to a plasma of hydrogen (H$_2$), a plasma of both H$_2$ and Ar or a plasma of nitrogen trifluoride (NF$_3$) and helium (He) in order to remove layer 14.

SUMMARY OF THE INVENTION

The present invention provides a method of forming contact structures that include a titanium glue layer in small-width, high aspect ratio (HAR) applications. Prior to deposition of the titanium layer, the contact hole is exposed to a plasma of halogen-containing gas, e.g., NF$_3$, and an inert gas. The inventors unexpectedly discovered that using such a plasma preclean step prior to the deposition of the titanium layer allows for deposition of the CVD titanium layer at a reduced temperature while maintaining relatively low contact resistance in small-width contact structures as compared to other types of preclean process. Prior to this discovery, it was not previously recognized that use of a particular type of preclean step would effect the temperature range that can be used for a subsequent CVD titanium step while maintaining desired contact resistance.

Embodiments of the invention allow for deposition of the titanium layer from a TiCl$_4$/H$_2$ plasma CVD deposition process at a deposition temperature of 650° C. or less thereby allowing creation of a completed contact structure having a contact resistance of less than 600 Ω for p$^+$ contacts and less than 300 Ω for n$^+$ contacts. The method of the present invention is suitable for the formation of contact structures in integrated circuits having feature sizes of 0.25 to 0.11 microns or less.

In one embodiment the method of the present invention forms a small-width HAR contact in an integrated circuit by forming a dielectric layer over a silicon substrate, etching a contact hole through the dielectric layer, exposing the etched contact hole to a plasma formed from a preclean gas comprising nitrogen trifluoride and helium and, thereafter, depositing a titanium layer within the contact hole by a plasma CVD process, where the plasma CVD process heats the substrate to a temperature less than or equal to 650° C.

These and other embodiments of the present invention, as well as its advantages and features, are described in more detail in conjunction with the text below and attached figures.

DETAILED DESCRIPTION OF PREFERRED EMBODIMENTS

I. Embodiments of the Invention

As discussed above, thermal budget constraints have become an important factor in the manufacture of integrated circuits (ICs). The industry is continuously striving for methods to reduce the overall thermal budget of IC manufacturing processes. In some IC manufacturing processes the contact formation process includes forming a CVD titanium layer within high aspect ratio, small-width contact holes at a deposition temperature of 680° C. or higher. In some of these particular processes, the relatively high titanium deposition temperature may be necessary to ensure that the resistance of the contact is below the maximum acceptable value defined by the IC manufacturer. As used herein, a "small-width" contact hole is a hole that has a bottom diameter of 0.25 μm or less and a "high aspect ratio (HAR)" is a contact that has an aspect ratio (height to width at the bottom of the contact) of at least 6:1.

The resistance of any given Ti/TiN contact structure such as that shown in FIG. 1A is dependent on the thickness of titanium silicide ($TiSi_x$) that is formed from the deposited Ti layer. As an example, for one particular process, 150–200 Å of $TiSi_x$ must be created during the contact formation process in order to have a sufficiently low contact resistance in N+ and P+ contacts. In order to achieve a $TiSi_x$ layer approximately 200 Å thick using a standard Ar sputter preclean step and a $TiCl_4/H_2$ plasma CVD deposition process, it was necessary to deposit approximately 100 Å of Ti at a deposition temperature of 680° C. At reduced titanium deposition temperatures it was necessary to deposit an even thicker titanium layer. For example, in order to obtain 200 Å of $TiSi_x$ at a deposition temperature of 650° C., it was necessary to deposit approximately 150 Å of Ti while at a deposition temperature of 620° C. it was necessary to deposit approximately 200 Å of Ti. As used herein, a "low temperature titanium deposition step" refers to a titanium deposition step that sets the pedestal temperature to 650° C. or less where it is recognized that wafer temperature is generally about 60–75° C. cooler than pedestal temperature.

The inventors unexpectedly discovered that a greater amount of $TiSi_x$ is created from a subsequent titanium deposition step when an $NF_3$/He plasma preclean step is used to preclean the contact area instead of a Ar plasma or HF wet dip preclean step. This in turn allows for a low temperature titanium deposition step to be used in a fabrication process while maintaining an acceptable process margin for the deposition step in processes where a high temperature titanium deposition step is otherwise necessary. It was not previously recognized that use of a particular type of preclean step has (1) an effect on the thickness of a subsequently formed titanium silicide layer, or (2) an effect on contact resistance over and above removal of dielectric material such as layer 14 is the contact area.

Figure 2:
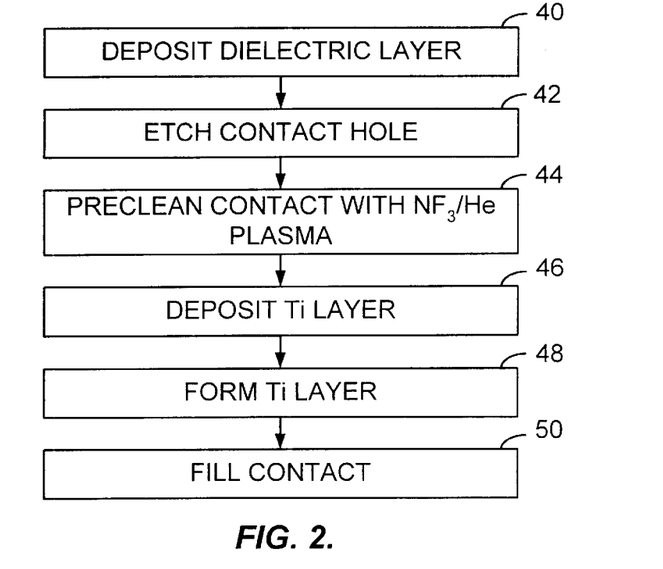
FIG. 2 is a flowchart of a method of forming a contact structure according to one embodiment of the present invention.

FIG. 2 is a flow chart illustrating one embodiment of the method of the present invention. As shown in FIG. 2, contact formation starts with forming a dielectric layer, for example, a BPSG layer, over the silicon substrate having transistors formed thereon (step 40). Next, a contact hole is etched through the dielectric layer using well known etching techniques (step 42). The contact hole is then precleaned using an $NF_3$/He plasma (step 44) prior to deposition of a titanium layer within the etched contact hole. In this preclean step, the wafer is subjected to a relatively brief (e.g., between 5 and 120 seconds in some embodiments and 5–60 seconds in other embodiments) plasma formed from a process gas of $NF_3$ and He. In this manner, a small fraction of the top surface of the wafer is etched away prior to the deposition step.

In one embodiment the $NF_3$/He plasma preclean process is performed in an ICP chamber manufactured by Applied Materials, the assignee of the present invention. Other embodiments of the invention may use other types of chambers. When used in an ICP chamber outfitted for 200 mm substrates, the following process parameters are used in some embodiments: pressure 0.5–500 mTorr; percent $NF_3$ of 1–20%, preferably 2–10%; temperature 100–600° C.; coil RF power 100–600 Watts, preferably 100–300 Watts and bias RF power 75–600 Watts, preferably 75–300 Watts.

In some embodiments, prior to completion of the plasma preclean step, a plasma purge step (not shown) is employed in order to prevent particles from dropping onto the wafer. In the plasma purge step, the source RF power is left ON while the bias RF power that biases that plasma toward the substrate is switched OFF or lowered to less than or equal to 25 Watts. In one embodiment, this plasma purge step lasts between 3–5 seconds.

After preclean step 44, a titanium layer is deposited over the substrate and within the contact hole (step 46). In one particular embodiment, the titanium layer is deposited from a process gas of $TiCl_4$ (source gas) and helium that is flowed into a resitively heated TixZ CVD chamber manufactured by Applied Materials that is outfitted for 8-inch wafers. Preferably, both the ICP and TixZ chambers are in a single, multichamber mainframe unit such as the Centura system manufactured by Applied Materials. The substrate is thus transferred from the ICP chamber to the TixZ chamber under vacuum conditions using a central robot.

Figure 3:
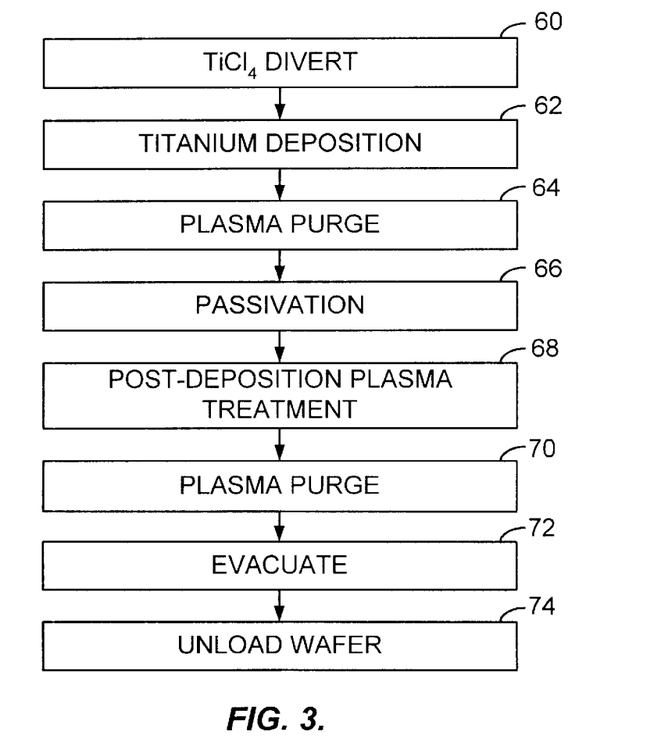
FIG. 3 is a flowchart of a process sequence used to deposit a titanium layer according to one embodiment of the method of the present invention.

Details of one particular titanium deposition step 46 are set forth in the flowchart of FIG. 3. As shown in FIG. 3, prior to initiating plasma deposition of the titanium layer, the $TiCl_4$ and He flows are initiated and diverted directly to the foreline (step 60). Diverting the flows in this manner, particularly the flow of $TiCl_4$, allows the flows to stabilize before deposition begins thus improving the uniformity of processing conditions among the various titanium deposition steps in a multi-wafer deposition sequence (e.g., a 2000 wafer run). It is preferred that the $TiCl_4$ flow be stabilized for between at least 6–8 seconds prior to deposition step 62. During this time and in some embodiments, prior to initiating the $TiCl_4$ and He flows, a plasma is formed within the chamber from a flow of Ar and $H_2$.

In deposition step 62, the $TiCl_4$ and helium gas flows are directed to flow into the chamber along with the argon and $H_2$ flows. $TiCl_4$ is in liquid form and is vaporized using a liquid injection system such as the gas panel precision liquid injection system (GPLIS) manufactured by STEC Corporation before being mixed with the helium carrier gas. In one embodiment, $TiCl_4$ is introduced at a rate of 50 mg/m; He is introduced at a rate of 2000 sccm; $H_2$ is introduced at 3000 sccm, Ar is introduced in a top flow of 5000 sccm and a bottom flow of 500 sccm; RF power is applied to the gas manifold at 300 Watts (350 KHz) and chamber pressure is set to 5 Torr. Deposition step 62 is maintained as long as required to deposit a film of selected thickness.

As previously stated, it is often important to maintain contact resistance below a prespecified value in order to meet a manufacturer's specifications for the contact formation process. At the same time, it is important to minimize the overall thermal budget of the integrated circuit process. The inventors have found that using an $NF_3$/He preclean step 44 rather than another type of preclean step enables the use of a low temperature titanium deposition step while enabling formation of a contact having contact resistance of substantially the same magnitude as if a different type of preclean step was used and the titanium deposition temperature was 680° C. It is believed that this is due to (1) a greater amount of $TiSi_x$ created from the titanium deposition step when employed after an $NF_3$/He preclean step; and (2) a cleaner film interface that leads to better conditions for ohmic contact.

After the completion of deposition step 62, the $H_2$, $TiCl_4$ and helium flows are turned OFF, the RF power is reduced, and the upper argon flow is reduced (step 64) in order to loosen any large particles that may have formed on the chamber during the deposition step. Next, about 3 seconds later, RF power is switched OFF and the titanium layer may be passivated. The titanium layer is passivated by forming a thin layer of titanium nitride at the titanium layer's surface such that impurities such as carbon and oxygen cannot be absorbed into the titanium. Such impurities can alter the resistance of the titanium layer and form an unsuitable surface for titanium nitride barrier layer deposition. Passivation may be accomplished by adding a flow of $H_2$ and $N_2$ to the argon flow as a passivation step 66 and/or forming a nitrogen plasma in a step 68. In one embodiment, both steps 66 and 68 are performed. When done in this manner, step 66 helps stabilize the chamber before post-deposition plasma treatment step 68 and purge $TiCl_4$ residue from the chamber. Also, the nitrogen reacts with the surface titanium to begin to form a thin layer of titanium nitride. In another embodiment, the plasma is not switched OFF between deposition step 62 and passivation step 66, and instead during step 64, gas flows are adjusted from those used in step 62 to those used in step 66.

After step 66, the titanium layer is further passivated at step 68 by applying RF energy to the $H_2/N_2/Ar$ passivation gases in the chamber to form a plasma. The passivation plasma may alternatively be formed in a remote plasma source and channeled to the chamber. The ionized nitrogen in the passivation plasma reacts with the surface of the titanium layer to complete the formation of a thin layer of titanium nitride during approximately 10 seconds of exposure. To form the plasma in the chamber, RF power is generally applied to the chamber showerhead. However, the RF power may be applied to a pedestal electrode or to both the pedestal electrode and showerhead. In one embodiment where both steps 66 and 68 are employed, each step lasts for about 8 seconds. In other embodiments where only step 66 or only step 68 are used, the step may be employed longer, e.g., between about 10–30 seconds.

After step 68 a second plasma purge step 70 is performed to further loosen any large particles that may be present in the chamber. Plasma purge step 70 is similar to plasma purge step 64, except that $N_2$ and $H_2$ flows are maintained in step 70 in addition to the argon flows. Finally, in step 72, all gas flows are shut off and the chamber is evacuated and then the wafer is unloaded from the chamber. Since the wafer has been, in general, passivated, the wafer can be exposed to the air without the titanium layer detrimentally absorbing impurities such as oxygen and carbon. As such, even long term exposure to air, e.g., days of exposure, does not degrade the properties of the titanium layer. Furthermore, the titanium nitride passivation layer provides a "clean" surface upon which subsequent processing can deposit a titanium nitride barrier layer (FIG. 2, step 48).

After deposition of the titanium layer, the contact hole is filled with a metal such as aluminum or tungsten (step 50).

Gas flow rates, pressure levels and other information according to the embodiments of the invention described with respect to FIGS. 2 and 3 above are based on utilizing the respective portions of the process in ICP and TixZ chambers outfitted for 8-inch wafers, respectively. As a person of ordinary skill in the art would understand, the actual rates at which gases are introduced in other embodiments will vary if other chambers of different design and/or volume are employed.

II. Comparative Examples

To show the effectiveness of the present invention, experiments were performed forming contact structures with and without the benefits of the method of the present invention. In the experiments, the preclean step was performed in an ICP plasma chamber while the Ti deposition step was performed in a TixZ chamber, both manufactured by Applied Materials. The ICP chambers and TixZ were situated in a Centura multichamber substrate processing system also manufactured by Applied Materials.

EXAMPLE 1

In a first experiment the inventors compared the effects of an HF wet etch preclean step with an $NF_3/He$ preclean step for a 0.2 $\mu$m contact hole having an aspect ratio of 4:1. The HF wet etch was a 100:1 HF dip that removed approximately 30 Å of dielectric layer. Similarly the $NF_3/He$ preclean plasma (3 sccm $NF_3$, 47 sccm He, 100 W source RF and 100 W bias RF at a pressure of 4 mTorr) also removed approximately 30 Å of dielectric layer. Subsequent titanium deposition step and titanium nitride deposition step deposited 100 Å of Ti and 200 Å of TiN over each contact.

The inventors discovered that both the HF wet etch and $NF_3/He$ preclean steps resulted in the formation of satisfactory contact structures at the 4:1 aspect ratio. In a subsequent test using a 6:1 aspect ratio contact, however, the inventor found that the HF wet etch solution was unable to adequately remove material from the bottom of the contact and resulted in redeposition of etched sidewall material onto the contact base. This in turn led to a variation in the contact resistance between contacts. An $NF_3/He$ plasma etch process used on the same 6:1 aspect ratio contact structure did not suffer from these problems and was successfully used to form satisfactory contact structures.

EXAMPLE 2

In a second set of experiments where 0.17 $\mu$m bottom diameter by 2.6 $\mu$m contact were formed, the inventors compared the contact resistance of a contact formed using an Ar preclean plasma with that of a contact formed using an $NF_3/He$ preclean plasma. The Ar preclean plasma formed the plasma from a flow of 5 sccm of Ar using 350 W source RF power and 300 W bias RF power and a chamber pressure of 3 mTorr. The $NF_3/He$ preclean plasma conditions were the same as those used in example 1. An HF wet etch preclean step on the same contact topography was also attempted but resulted in a large variation of contact resistance due to sidewall material redeposition problems as discussed above.

In these experiments, a 100 Å CVD Ti layer was deposited over the contact structure after each of the Ar and $NF_3/He$ preclean processes. The CVD Ti layer was deposited at three different temperatures (620° C., 650° C. and 680° C.) for each preclean process. Thus, a total of six wafers were tested in this manner. After deposition of the Ti layer, a 200 Å TiN layer was deposited over each substrate and then each contact was filled with a tungsten plug. Process conditions for the TiN and W deposition steps were identical for all six wafers.

Figure 4A:
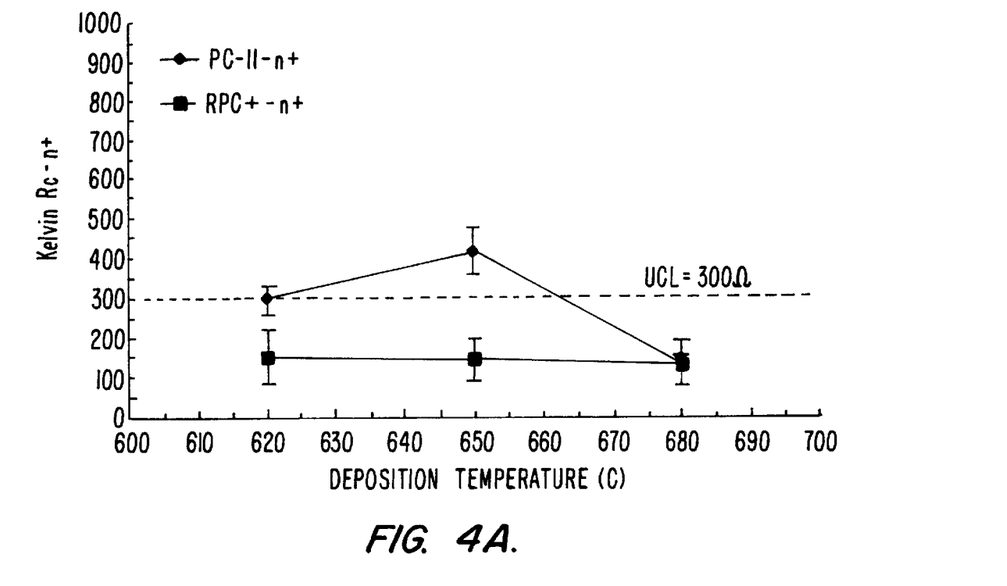
FIGS. 4A and 4B are graphs comparing contact resistance for contacts formed according to the method of the present and contacts formed according to prior art methods.
Figure 4B:
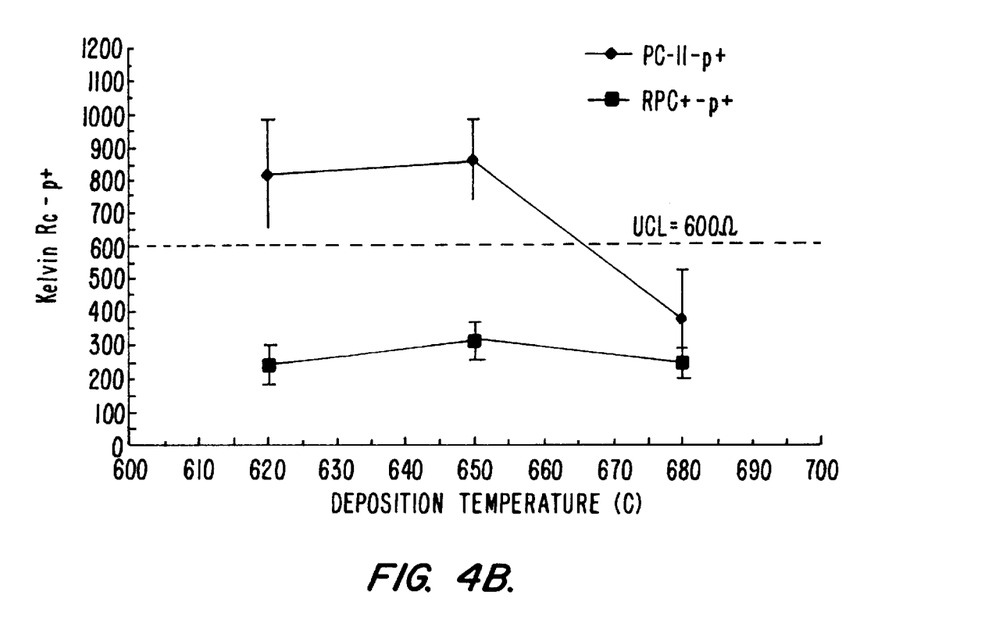

FIGS. 4A and 4B show the comparison of contact resistance for the six wafers for N+ and P+ contacts, respectively. In FIG. 4A, a contact resistance of 300 Ω is the manufacturer's specification for N+ contacts and in FIG. 4B, a contact resistance of 600 Ω is the process manufacturer's specification for P+ contacts. Also in the figure, square data points represent measurements from contacts formed using an $NF_3/He$ preclean step while circular data points represent measurements from contacts formed using an Ar preclean step. As evident from FIG. 4A, a titanium deposition temperature of 680° C. resulted in sufficient N+ contacts (i.e., a contact that meets the manufacturer specifications) when the contact was precleaned with either the Ar plasma or the $NF_3$/He plasma. At lower temperatures, however, only the $NF_3$/He preclean process enabled the lower temperature titanium deposition temperature to meet the manufacturer specifications. Furthermore, when deposition temperature dropped to 650° C. contact resistance increased by approximately 250 Ω (more than 100%) for the Ar preclean process while changing little for the $NF_3$/He preclean process.

Similarly, as shown in FIG. 4B, a titanium deposition temperature of 680° C. resulted in P+ sufficient contacts when the contact was precleaned with either the Ar plasma or the $NF_3$/He plasma. At lower temperatures, however, only the $NF_3$/He preclean process enabled the lower temperature titanium deposition temperature to meet the manufacturer specifications for P+ contacts. Also, contact resistance again increased substantially (about 100% or higher) when the CVD titanium deposition temperature decreased to 650° for the Ar preclean process while remaining within 50 Ω for the $NF_3$/He preclean process.

EXAMPLE 3

In a third set of experiments where 0.17 μm bottom diameter by 2.6 m contact were formed the inventors compared the contact resistance of a contact formed using an Ar preclean plasma with that of a contact formed using an $NF_3$/He preclean plasma. The Ar and $NF_3$/He preclean plasmas were formed under the same process conditions as described above for example 2.

In these experiments, different thickness CVD Ti layers were deposited at 650° C. over contact structures after Ar/He and $NF_3$/He preclean processes. The CVD Ti layers were deposited at 100 Å and 150 Å for each preclean process. Thus, measurements from four wafers were taken. After deposition of the Ti layer, a 200 Å TiN layer was deposited over each substrate and then each contact was filled with a tungsten plug. Process conditions for the TiN and W deposition steps were all identical for all four wafers.

Figure 5A:
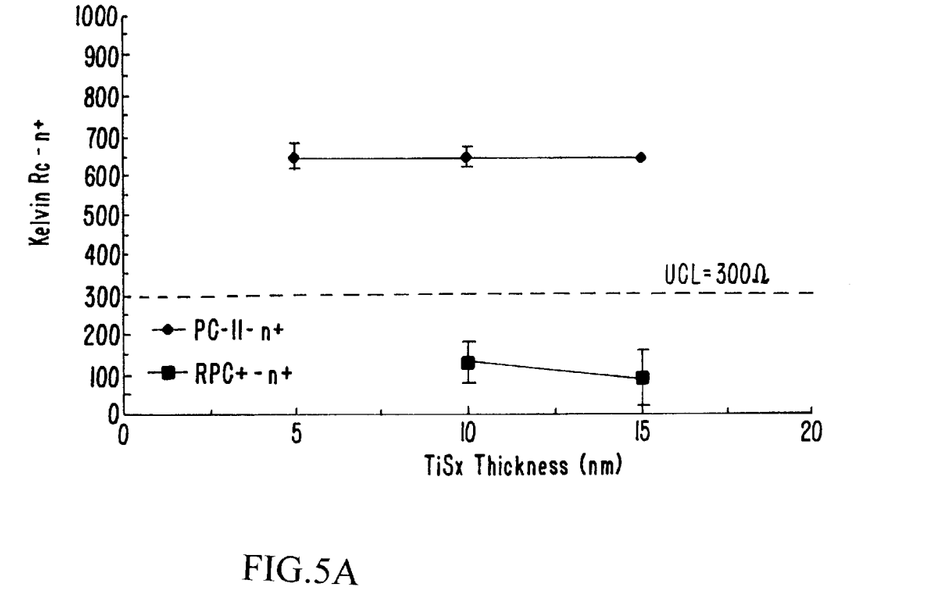
FIGS. 5A and 5B are additional graphs comparing contact resistance for contacts formed according to the method of the present and contacts formed according to prior art methods.
Figure 5B:
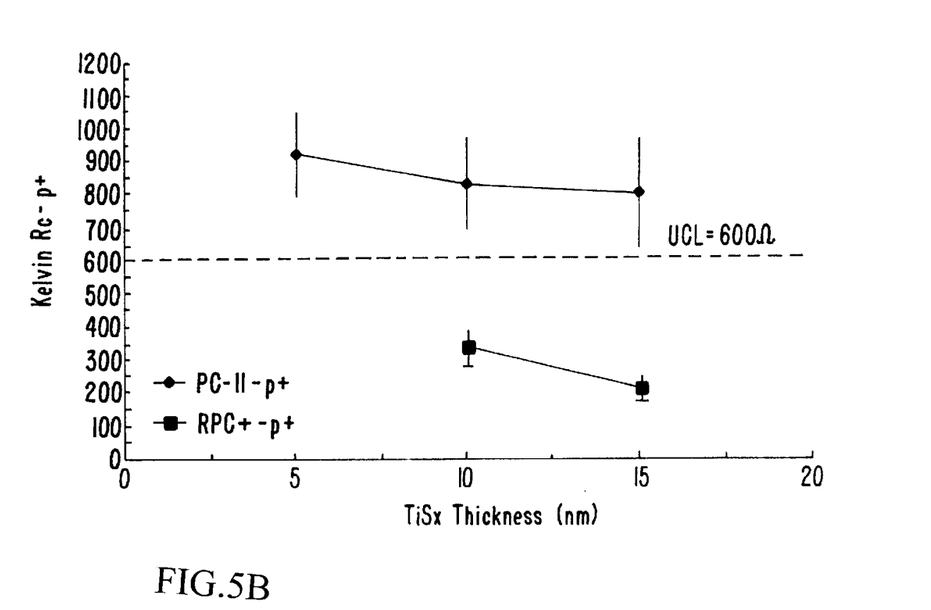

FIGS. 5A and 5B show the comparison of contact resistance for the four wafers for N+ and P+ contacts, respectively. In FIG. 5A, a contact resistance of 300 Ω is the manufacturers specification for N+ contacts and in FIG. 5B, a contact resistance of 600 Ω is the process manufacturers specification for P+ contacts. Also in the figure, square data points represent measurements from contacts formed using an $NF_3$/He preclean step while circular data points represent measurements from contacts formed using an Ar/$H_2$ preclean step.

As evident from FIG. 5A, when the contact was precleaned with an $NF_3$/He plasma, a titanium deposition temperature of 650° C. resulted in sufficient N+ contacts (i.e., a contact that meets the manufacturers specifications) for both 100 and 150 Å titanium layers. When the contact was precleaned with the Ar plasma, however, a titanium deposition temperature of 650° C. was not able to create N+ contacts within the manufacturers specifications for either 100 or 150 Å titanium layers. Similar results were found for P+ contacts.

The parameters listed in the above process and experiments should not be limiting to the claims as described herein. One of ordinary skill in the art can modify the process described above by using process parameters and conditions other than those described with respect to the preferred embodiments. As such, the above description is illustrative and not restrictive and the present invention is applicable to depositing titanium films in a variety of different deposition and cleaning processes. For example, while helium was included in the $NF_3$/He preclean plasma gas other substantially inert gases could be used instead of or in addition to helium. For example, in other embodiments $N_2$ or Ar could be used in place of or in addition to helium. As a further example, while $NF_3$ was used as the halogen source, the inventors believe that other halogen sources, such as $F_2$, $Cl_2$, $C_2F_6$, $SF_6$ and the like, could also be used. Also, a remote microwave plasma system can be used to dissociate process gas molecules during the titanium deposition process and/or the plasma preclean process. The scope of the invention should, therefore, be determined not with reference to the above description, but instead should be determined with reference to the appended claims along with their full scope of equivalents.

What is claimed is:

1. A method of forming a small-width, high aspect ratio contact in an integrated circuit, said method comprising:

(a) forming a dielectric layer over a silicon substrate;

(b) etching a contact hole through said dielectric layer;

(c) exposing said etched contact. hole to a plasma formed from a preclean gas comprising a halogen-containing source and helium; and (d) thereafter, depositing a titanium layer within said contact hole by a plasma CVD process, wherein said plasma CVD process heats said substrate to a temperature less than or equal to 650° C.

2. The process of claim 1 wherein said plasma of said preclean gas etches at least 10–50 Å of said dielectric layer.

3. The process of claim 2 wherein said titanium layer is formed from a process gas comprising $TiCl_4$.

4. The process of claim 3 wherein said dielectric layer is selected from the group of undoped silicate glass (USG), phosphorus doped silicate glass (PSG), boron phosphorus silicate glass (BPSG) and fluorine doped boron phosphorous silicate glass (F-BPSG).

5. The process of claim 4 wherein said titanium layer is deposited to cover a bottom of said contact opening and form a titanium silicide layer at said bottom.

6. The process of claim 5 wherein said titanium silicide layer is at least three times as thick as said deposited titanium layer.

7. The process of claim 1 wherein said plasma of said preclean gas is maintained for between about 5 and 120 seconds.

8. The process of claim 7 wherein said plasma of said preclean gas is maintained for between 5 and 60 seconds.

9. The process of claim 7 wherein said titanium layer is formed from a plasma of vaporized $TiCl_4$ and a hydrogen-containing source.

10. The process of claim 9 wherein said hydrogen-containing source comprises $H_2$.

11. The process of claim 1 wherein said halogen-containing gas comprises $NF_3$.

12. The process of claim 1 wherein said exposing and depositing steps are performed in separate chambers of a multichamber cluster tool and said substrate is transferred under vacuum conditions from a first chamber of said tool in which said exposing step is performed directly to a second chamber of said tool in which said depositing step is performed.

13. A method of forming a small-width, high aspect ratio contact in an integrated circuit, said method comprising:

(a) forming a dielectric layer over a silicon substrate;

(b) etching a contact hole through said dielectric layer;

(c) exposing said etched contact hole to a plasma formed from a preclean gas consisting of nitrogen trifluoride and helium; and (d) thereafter, depositing a titanium layer within said contact hole by a plasma CVD process, wherein said plasma CVD process heats said substrate to a temperature less than or equal to 650° C.

14. A method of forming a small-width, high aspect ratio contact in an integrated circuit, said method comprising:

(a) forming a dielectric layer over a silicon substrate;

(b) etching a contact hole through said dielectric layer;

(c) exposing said etched contact hole to a plasma formed from a preclean gas comprising a halogen-containing source and an inert gas; wherein said exposing step comprises biasing said plasma toward said substrate during a first process stage, and during a second process stage subsequent to said first process stage, reducing said bias power level; and (d) thereafter, depositing a titanium layer within said contact hole by a plasma CVD process, wherein said plasma CVD process heats said substrate to a temperature less than or equal to 650° C.

15. The process of claim 14 wherein said bias power level is reduced to 0 Watts during said second process stage.

16. A method of forming a small-width, high aspect ratio contact in an integrated circuit, said method comprising:

(a) forming a silicon oxide layer over a silicon substrate having a p-doped source/drain region formed thereon;

(b) etching a contact hole through said dielectric layer to said p-doped source/drain region;

(c) exposing said etched contact hole to a plasma formed from a preclean gas consisting of nitrogen trifluoride and helium for between 5 and 120 seconds; and (d) thereafter, depositing a titanium layer within said contact hole by a plasma CVD process from a process gas comprising $TiCl_4$ and a hydrogen source, wherein said process heats said substrate to a temperature less than or equal to 650° C.;

wherein a contact resistance of said contact is within 50 Ω of what said contact resistance would have been if said contact was formed by using an identical process except for forming said plasma CVD titanium layer at a temperature of 680° C.

17. The process of claim 16 wherein said exposing step comprises biasing said plasma toward said substrate during a first process stage; and during a second process stage subsequent to said first process stage, reducing said bias power level.

18. The process of claim 17 wherein said bias power level is reduced to 0 Watts during said second process stage.

19. The process of claim 16 wherein said exposing and depositing steps are performed in separate chambers of a multichamber cluster tool and said substrate is transferred under vacuum conditions from a first chamber of said tool in which said exposing step is performed directly to a second chamber of said tool in which said depositing step is performed.

* * * * *